United States Patent [19]

Bhagat

[11] Patent Number: 4,636,830

[45] Date of Patent: Jan. 13, 1987

[54] INSULATED GATE-CONTROLLED THYRISTOR HAVING SHORTED ANODE

[75] Inventor: Jayant K. Bhagat, Troy, Mich.

[73] Assignee: General Motors Corporation, Detroit, Mich.

[21] Appl. No.: 667,827

[22] Filed: Nov. 2, 1984

Related U.S. Application Data

[63] Continuation-in-part of Ser. No. 617,106, Jun. 4, 1984.

[51] Int. Cl.$^4$ .................. H01L 29/72; H01L 29/78; H01L 29/08; H01L 29/06
[52] U.S. Cl. ........................................ 357/38; 357/43; 357/56; 357/86
[58] Field of Search .................. 357/38, 43, 56, 86

[56] References Cited

U.S. PATENT DOCUMENTS 3,239,728 3/1966 Aldrich et al. .................. 357/38

Primary Examiner—William D. Larkins
Assistant Examiner—John Lamont
Attorney, Agent, or Firm—Robert J. Wallace

[57] ABSTRACT

A new semiconductor power device, suitable for electrical switching in automotive applications, is proposed. This device combines the low specific on-resistance achievable with bipolar regenerative switching devices with the convenience of insulated gate control of not only turn-on but also turn-off. A device structure is presented that also includes a pinch resistance effect to more rapidly produce turn-off. The anode region of the device is electrically shorted to its contiguous N-type region.

4 Claims, 14 Drawing Figures

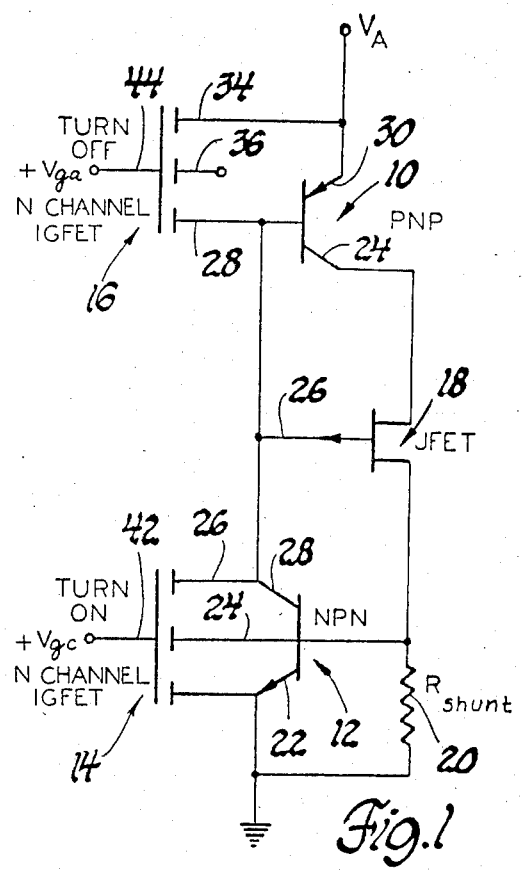
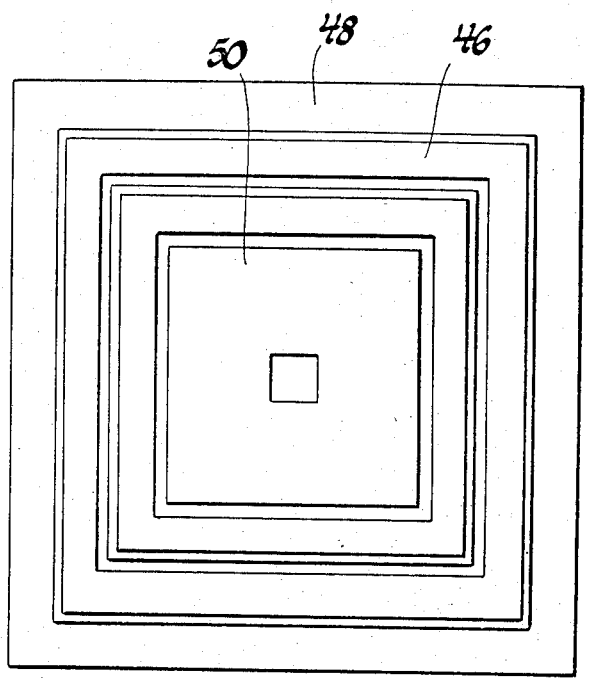
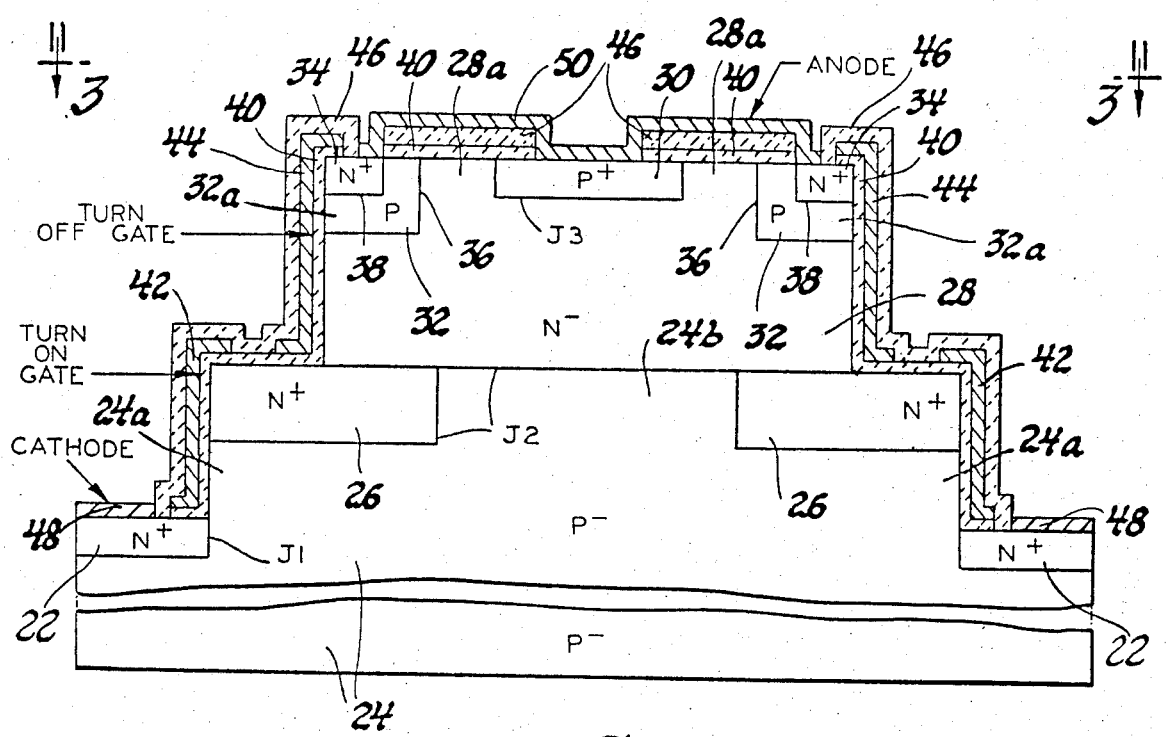
Fig.1
Fig.3
Fig.2

INSULATED GATE-CONTROLLED THYRISTOR HAVING SHORTED ANODE

RELATED PATENT APPLICATIONS

This patent application and my concurrently filed U.S. patent application Ser. No. 667,845, filed Nov. 2, 1984 entitled "Insulated Gate-Controlled Thyristor", are continuations-in-part of my U.S. patent application Ser. No. 617,106, entitled "Integrated Field Controlled Thyristor Structure with Grounded Cathode" that was filed on 4 June 1984 and is assigned to the assignee of this invention. This patent application describes and claims an improvement on the basic invention described and claimed in Ser. No. 667,845.

FIELD OF THE INVENTION

This invention relates to thyristor structures and more particularly to a particular dual gate silicon controlled rectifier in which one gate is used for device turn-on and the other gate is used for device turn-off.

BACKGROUND OF THE INVENTION

Numerous semiconductor devices can be used as power switches. These devices include thyristors, bipolar junction transistors, junction field effect transistors, insulated gate field effect transistors, field controlled thyristors, insulated gate-controlled thyristors, and bipolar mode conductivity modulated field effect transistors. The choice of which device is preferred for a particular application is a function of many factors. These factors include the desired current handling capability of the device, the forward and reverse blocking voltages desired, turn-on and turn-off time desired, circuit environment considerations such as resistive/inductive loads encountered, drive requirements, cost, etc.

Some applications of power switches require switching of low voltages at high currents. For example, automotive applications require switching of approximately 12 volts at currents of about 10-100 amperes. Using semiconductor devices rather than electromechanical relays to do this switching offers advantages of reliability, cost and ease of use in interfacing with control circuitry. Such advantages are obviously significant.

There are several characteristics which are particularly desirable in thyristor devices used for automotive switching applications. Such characteristics include a grounded cathode for compatibility with the automotive electrical system and control by means of low current and low positive voltages. This provides simpler interfacing and better electrical compatibility with other circuits in the automotive system. In addition, it is desired that the thyristor not only be rapidly turned on, but also rapidly turned off, by the low power positive control voltages. Low cost is very important too. In order to achieve low cost, a high current density device with a low on-resistance is desired. This minimizes silicon chip area in the device and thereby improves yields, while keeping heat sinking and packaging costs to a minimum.

The known type of thyristor having an insulated gate for turn-on has most of the foregoing desirable features. However, it cannot be turned off unless current density drops to a very low value. I have found how to add an insulated gate to such a device that provides rapid turn-off even when anode voltage stays high.

OBJECTS AND SUMMARY OF THE INVENTION

It is an object of this invention to provide a dual insulated gate thyristor, in which one gate turns the thyristor on and the other turns the thyristor off, having an anode semiconductive region electrically shorted to a contiguous thyristor semiconductive region of opposite conductivity type.

Another object of the invention is to provide a new dual gate thyristor that is improved in its capability to withstand increased temperature and voltage spikes without turning on.

The invention comprehends a dual gate thyristor in which a turn-on gate is part of an integrated insulated gate field effect transistor (IGFET). The turn-off gate is also an insulated gate that produces a field effect. It creates a lower resistance surface channel that allows an electrically floating pinch resistor region to approach anode potential. The result is a pinch resistance effect for accelerating thyristor turn-off. The pinch resistance effect is produced in one example of the invention by a supplemental ring-like region of opposite conductivity that encircles a current flow path in either or both of the base regions of the integrated PNP and NPN transistors forming in the thyristor. A specific improvement contemplated in this patent application resides in electrically shorting the thyristor anode region to its contiguous opposite conductivity type region.

BRIEF DESCRIPTION OF THE DRAWINGS

Other objects, features and advantages of this invention will become more apparent from the following description of preferred examples thereof and from the drawings, in which:

FIGS. 1-8 show the basic invention described and claimed in the related U.S. patent application Ser. No. 667,845

FIG. 1 shows an electrical schematic of the thyristor basic to this invention;

FIG. 2 shows a cross-sectional view of the basic thyristor;

FIG. 3 shows a plan view along the line 3—3 of FIG. 2;

FIG. 4 shows a cross-sectional view of a first modification of the basic thyristor;

FIG. 5 shows a view along the line 5—5 of FIG. 4;

FIG. 6 shows a cross-sectional view of a second modification of the basic thyristor;

FIG. 7 shows an electrical schematic of an alternative embodiment of the basic invention;

FIG. 8 shows a cross-sectional view of a thyristor represented by the electrical schematic shown in FIG. 6;

FIG. 9 shows an electrical schematic of the improvement on the basic invention contemplated by this patent application;

FIG. 10 shows a cross-sectional view of the improvement represented by the electrical schematic shown in FIG. 9;

FIG. 11 shows a view along the line 11—11 of FIG. 10;

FIG. 12 shows an electrical schematic of an alternative embodiment of the improvement to the basic invention contemplated herein;

FIG. 13 shows a cross-sectional view of the thyristor improvement represented by the electrical schematic shown in FIG. 12; and FIG. 14 shows a cross-sectional view of another alternative embodiment of my improved thyristor.

DESCRIPTION OF THE PREFERRED EMBODIMENTS

Figure 4:
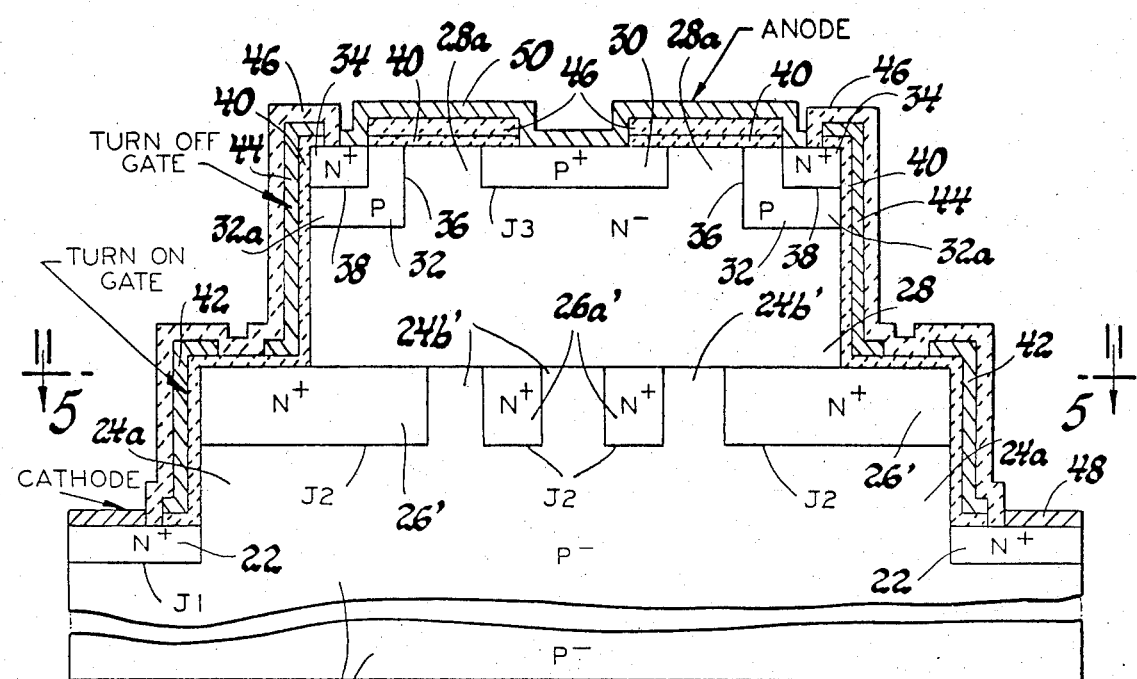

As hereinbefore indicated this invention is an improvement on a basic PNPN rectifier structure that has a grounded cathode and two insulated control gates, one for turn-on and one for turn-off. I refer to the rectifier structure as a thyristor since it is fundamentally a bipolar type of device that uses conductivity modulation to handle high current densities and provide a low specific on-resistance. The control gates are actually gate electrodes of separate integral insulated gate field effect devices such as insulated gate field effect. They can be transistors (IGFETs) controlled with positive or negative electrical potentials, depending on device construction. In addition, my basic thyristor structure provides a pinch resistance, analogous in operation to a junction field effect transistor that is activated by the turn-off control gate. In the improved version of such a thyristor contemplated in this invention the first P region of contiguous PNPN regions is electrically shorted to its contiguous N-type region.

As hereinbefore mentioned, insulated gates have been used to turn on thyristors. However, such thyristors can only be turned off when current density drops to a low value. My thyristor additionally has a second insulated gate and pinch resistance to provide turn-off even though current density does not decrease. The extra complexity introduced into the structure by using two control terminals and the pinch resistance is not considered to be significant when one considers the advantage obtained, particularly for microprocessor controlled applications. Moreover, as hereinafter explained, in some embodiments of my thyristor it is desirable to electrically short the anode to the turn-off gate, which results in only a three-terminal device.

As hereinbefore mentioned, the basic invention on which this invention is an improvement is shown in connection with FIGS. 1-8. Reference is now made to FIG. 1, which shows an electrical schematic that represents the basic integrated electrical devices shown in FIGS. 2-8. My basic thyristor can thus be considered as including a PNP transistor 10, a NPN transistor 12, a first insulated gate field effect transistor (IGFET) 14, and a second insulated gate field effect transistor (IGFET) 16. It also includes a pinch resistance, which I prefer to refer to as a junction field effect transistor (JFET) 18. FIG. 1 also shows a resistance 20, that is identified as $R_{shunt}$. Resistance 20 is an internal resistance, between the emitter and the base of the NPN transistor, that is used in the normal and accepted way to produce device turn-on when IGFET 14 is activated.

Reference is now made to FIG. 2 which shows a specific embodiment of the basic thyristor electrically represented by FIG. 1. The embodiment is not drawn to scale, to make illustration easier. The structure shown in FIG. 2 is fundamentally concentric. Hence, it is symmetrical about its vertical center line. In particular, FIG. 2 shows a rectangular P− silicon body member 24 having a reduced cross-section zone on its edge that forms a step. An N− layer 28 on the P− body 24 provides a second reduced cross-section zone, that forms a second step on the periphery of the device. The top surface of the device forms a third step. The tread-portion of the lowest step on silicon body 24 has a ring-like N+ region 22 on its circumference. The tread-portion of the middle step has a middle ring-like N+ region 26. It can be considered that the middle N+ ring 26 is disposed on the periphery of the upper surface of P− body 24, so that it encircles a current flow portion 24b of body 24. A spacing between the lower N+ ring 22 and the middle N+ ring 26 should be maintained to insure that there is adequate shunt resistance 20 between PN junction J2 and cathode 22. For a doping level of about $1 \times 10^{14}$ or $1 \times 10^{15}$ impurity atoms per cubic centimeter in P− region 24, I would like this spacing to be at least of the order to 10 micrometers, preferably 30. An N− epitaxial layer 28 of the order of about 500–1,000 micrometers wide and about 20–50 micrometers thick is disposed on the upper surface of the P− body 24, over its central portion 24b and overlapping onto the inner circumferential portion of the middle N+ region 26. N− layer 28 could have a doping level of about $1 \times 10^{14}$ or $1 \times 10^{15}$ impurity atoms per cubic centimeter. The preferred width of layer 28 depends on the current capability desired for the device and the bonding wire diameter that is to be used. The preferred thickness of layer 28 depends upon the voltage breakdown characteristic desired. The range in width and thickness given is intended for a 5 ampere, 100 volt device. An island-like P+ region 30 is centrally disposed on the upper surface of the N− epitaxial layer 28. The P+ and N+ doping levels can be about $1 \times 10^{19}$ to $1 \times 10^{20}$ impurity atoms per cubic centimeter in my device.

The lower N+ ring 22 forms a PN junction, identified as J1, with the P− body portion 24. The P− body portion 24 forms a second PN junction, identified as J2, with the middle N+ ring 26 and the N− epitaxial layer 28. The epitaxial layer 28 forms a third PN junction, identified as J3, with the island-like region 30. Junctions J1 and J2 comprise the NPN transistor 12. Junctions J2 and J3 comprise the PNP transistor 10.

Accordingly, it can be considered that the lower N+ ring 22 is an emitter region for the NPN transistor 12, while the P+ region 30 is the emitter region for the PNP transistor 10. The P− body portion 24 can be considered as being both the base region of the NPN transistor and the collector region of the PNP transistor. Analogously, both the middle N+ ring 26 and its contiguous N− epitaxial layer 28 can be considered as being both the collector region of the NPN transistor 12 and the base region of the PNP transistor 10.

The upper surface of the epitaxial layer 28 has a circumferential P-type ring 32 on its outer periphery, outwardly spaced from the P+ island 30. Accordingly, the P-type ring 32 forms a concentric ring around the P+ island region 30, with a portion 28a of the epitaxial layer 28 between them. An N+ circumferential ring 34 is nested wholly within the outer periphery of the P-type ring 32. It thus forms a third and upper N+ ring, that is disposed on the top step of the device structure. This top step is the outer edge of the upper surface of the epitaxial layer 28. A PN junction 36 separates the P-type ring 32 from the epitaxial layer 28. A PN junction 38 separates the upper N+ ring 34 from its surrounding P-type ring 32.

A 1,000–10,000 angstrom thick silicon dioxide film 40 of IGFET gate quality covers the top and sides of the epitaxial layer 28 and the silicon body 24. This silicon dioxide layer need not be uniform on the top and side of the epitaxial layer 28 and the silicon body 24. On the sides of layer 28 and body 24 it can be thinner than on top of layer 28. By IGFET gate quality, I mean silicon dioxide film 40 is chemically pure and substantially pin-hole free, as is usually desired for a gate dielectric in an insulated gate field effect transistor. A first circumferential polycrystalline silicon electrode 42 is disposed on the middle step and on the contiguous riser portion, i.e. side wall, of the body 24 beneath it. Thus, it extends from the N+ lower ring 22 up to the N+ middle ring 26. A second circumferential polycrystalline silicon electrode 44 is disposed on the middle and top steps and on the interjacent riser portion, i.e. side wall, of the epitaxial layer 28 therebetween. Thus, it extends from the N+ middle ring 26 to the upper N+ ring 34. These polycrystalline silicon electrodes can be formed by a single polycrystalline silicon layer followed by a proper delineation process to define the electrodes.

A phosphosilicate glass coating 46 covers the dielectric coating 40 and the polycrystalline silicon electrodes 42 and 44. Windows in the dielectric coating 40 and the phosphosilicate glass coating 46 are provided so that a metal electrode 48, referred to herein as a cathode, can make contact with the N+ ring 22. Windows are also provided in the phosphosilicate glass coating 46 and in the dielectric coating 40 over the P+ island 30 and over its concentric upper N+ ring 34, so that a metal electrode 50 can selectively make contact with both of the P+ island and the upper N+ ring. In other words, upper N+ region 34 is electrically in parallel with the PNP emitter region 30 by means of the metal electrode 50. The metal electrode 50 is referred to herein as an anode. In operation, anode 50 is connected to a source of electrical potential that is positive with respect to the electrical potential applied to the cathode 48. In automotive applications, the cathode would be grounded together with the P− body 24.

A first N-channel IGFET is used to turn-on this thyristor embodiment of my invention. It is indicated by reference numeral 14 in FIG. 1. In FIG. 2, it comprises the lowermost N+ ring 22 as a source region, the middle N+ ring 26 as a drain region, and the surface adjacent portion 24a of P− body 24 between them as a channel region. The IGFET 16 used for turn-off of the device is also an N-channel IGFET. It is formed by the middle N+ ring 26 and the side wall portion of the epitaxial layer 28 as a source region, the upper N+ ring 34 as a drain region, and the surface adjacent portion 32a of P-type ring 32 between them as a channel region. Polycrystalline silicon electrode 42 forms a gate electrode for turn-on IGFET 14. It thus forms a turn-on control gate for my thyristor. Analogously, polycrystalline silicon electrode 44 forms a gate electrode for turn-off IGFET 16. It thus forms a turn-off control gate for my thyristor.

It should be noted that the middle portion 24b on the upper surface of silicon body 24 projects upwardly into the center of the middle circumferential N+ ring 26. Hence, ring 26 completely encircles portion 24b. It should also be noted that the middle N+ ring 26 has no electrical contact to it. It is allowed to electrically float in accordance with potentials applied to the cathode 48, anode 50 and the gate electrodes 42 and 44. It should also be noted that the resistance $R_{shunt}$, indicated by reference numeral 20 in FIG. 1, is an internal resistance in the silicon body region 24 extending from portion 24b to the cathode contact 48. As is previously known for thyristors turned on by means of an insulated control gate, the shunt resistance 20 is of a value related to the characteristics of the turn-on IGFET that produces turn-on of the thyristor at a predetermined control gate voltage. While shunt resistance 20 should be considered here, it is no more important to this invention than it is to the prior single insulated gate controlled thyristors.

Assuming the thyristor shown in the drawing is in a forward blocking state, with a gate potential applied to neither IGFET 14 nor 16, the thyristor is turned on when a positive potential is applied to control gate 42. This produces an N-type channel in body portion 24a beneath gate electrode 42 that interconnects the N+ regions 22 and 26. Electrons can then flow from the cathode 48 to the N+ region 26 and be finally collected by anode 50. This lowers the electrical potential on N+ ring 26 and N− epitaxial region 28, and forward biases the emitter-base PN junction J3 of the PNP transistor 10, tending to turn-on the PNP transistor 10. This action provides holes for injection into the base region 24 of the NPN transistor 12 across its emitter-base PN junction J1. Since the emitter-base PN junction J1 is already forward biased, the supply of hole current provides base drive to the NPN transistor, tending to turn it on.

The voltage drop across the shunt resistance 20 is sufficient to allow the forward bias of the NPN transistor 12 and emitter-base PN junction J1. The current gain alpha of each of the two transistors increases as current increases. When the sum of the two alphas exceeds one, regenerative switching to a low voltage, high current state will take place, as is known. Accordingly, for turn-on, my thyristor is similar to the prior single insulated gate thyristors previously referred to. Commercially available versions of these are referred to as COMFETs and as IGTs. I consider that turn-on operation and design principles are similar. For example, in such types of prior art devices, the shunt resistance 20 is of a value, as compared to the conduction characteristics of the turn-on IGFET 14 to forward bias the base-emitter junction of the NPN transistor 12. Since shunt resistance 20 serves a turn-on purpose in this invention similar to what it does in the prior COMFET, the same prior considerations respecting its use should still be observed. This invention does not change them.

In any event, once regenerative switching starts, i.e. the NPN and PNP transistors are latched, current flow occurs in the manner previously described by conventional thyristor theory. In that circumstance, the positive voltage, i.e. turn-on voltage, need no longer be applied to the gate electrode 42 of the turn-on IGFET 14, as with some prior art devices. Accordingly, removing the positive voltage from the gate electrode 42 does not turn the thyristor off. Thus, as in a latched-on COMFET, conduction will continue until the anode-cathode voltage difference is no longer sufficient to provide injection across the emitter-base junction of the PNP and/or NPN transistors 10 and 12. In some prior devices, conduction can be stopped, i.e. before anode-cathode potential drops to a low value, by applying a negative potential to an appropriate gate electrode. On the other hand, one neither has to wait until the anode-cathode voltage drops nor has to apply a negative voltage in my preferred thyristor. One can stop regenerative switching, i.e. turn off the thyristor, by applying a positive potential to the second gate electrode 44, even if the anode-cathode voltage has not dropped at all. Thus, a positive potential is used both to turn on and to turn off this embodiment of my invention.

Turn-off of this thyristor is obtained by means of the second IGFET 16. As previously mentioned, turn-off is produced by first turning off IGFET 14, if it was not previously turned off. This is accomplished, of course, by removing the positive potential that was previously applied to gate electrode 42, to turn on the thyristor. Turn-off of the thyristor can then be accomplished by turning on IGFET 16. IGFET 16 is turned on by applying a positive electrical potential to the gate electrode 44, of the turn-off IGFET 16 that is above a channel threshold value. This produces an N-type channel 32a along the surface of the P-type outer ring 32 beneath the gate electrode 44. The N-type channel provides a low resistance electrical path between the epitaxial layer 28 and the upper N+ ring 34, which is in direct contact with anode 50. Three effects are produced. First, it should be recalled that epitaxial layer 28 serves not only as the collector for the NPN transistor 12, but also as the base region for the PNP transistor 10. Hence, when the voltage on gate 44 is above threshold value, electrons have a parallel path around the base region of the PNP transistor 10 directly to the anode. Secondly, this low current path is electrically in parallel with the base-emitter junction J3 of the PNP transistor 10. Accordingly, the forward bias of the PNP transistor emitter-base junction J3 will be reduced, reducing hole injection across this junction. The attendant hole current flow through the PNP transistor 10 is thus reduced, reducing base drive to NPN transistor 12 that tends to turn it off.

It should be recognized that turn-off gate 44 does not just extend to the N− epitaxial layer 28. It extends completely across the edge of N− epitaxial layer onto the middle N+ ring 26. Thus, the N− channel produced by a positive potential on gate 44 provides a low electrical resistance path between upper N+ ring 34 and middle N+ ring 26. Thirdly, it should be recalled that (a) the upper N+ ring 34 is shorted to anode 50 and (b) the middle N+ ring 26 electrically floats. When the turn-off IGFET 16 is conducting, the electrical potential of the middle N+ ring 26 approaches that of anode 50. The resulting strong reverse bias on the junction J2 produces a space charge region that inhibits current flow through the center portion 24b of the silicon body 24.

More specifically, when the middle N+ ring 26 is at about anode potential, it acts as a junction field effect transistor gate in pinching off the path for hole flow from anode 50 through the P− region to cathode 48. Thus, conductivity modulation of N− region 28 rapidly ceases, to reestablish the nonregenerative condition. Accordingly, I show the pinch resistor as the junction field effect transistor (JFET) 18, in which its source and drain would be the top and bottom of P− region 24b, respectively. In this connection, it should be noted that the principal hole flow would occur from the centrally disposed P+ island-like region 30 which is aligned over the central P− portion 24b. Since the epitaxial layer is only lightly doped, the predominant hole flow will occur from the P+ island 30 directly to the central P− portion 24b aligned beneath it, rather than to the outlying portions of the P− body 24 beneath the middle N+ ring 26. When the positive potential is applied to the turn-off gate electrode 44, the resulting positive field on the side wall of epitaxial layer 28 tends to confine hole flow into the middle of the epitaxial layer 28.

In order to throttle the anode-to-cathode hole current flow in accordance with this invention, it is thus desirable that the emitter 30 of the PNP transistor be centrally located and that the P-type body 24 and the N-type epitaxial layer 28 both be lightly doped. On the other hand, such doping is normally inherent to a thyristor. Accordingly, the same type of doping relationships and levels can be used in this invention that would ordinarily be used in any other thyristor. It should be observed, of course, that the middle N+ ring 26 should have an inner diameter that is small enough to completely pinch off hole current flow through the central P− portion 24b, at the field effect produced on the portions 24b at the voltage and current flow at which turn-off is desired. That field effect would depend upon the voltage applied at anode 50, the conductivity of the turn-off IGFET 16, the conductivity of N+ ring 26, current flow from anode-to-cathode, etc. The inner diameter of my thyristor is thus variable, depending on a plurality of factors. However, for automotive applications, I prefer that the inner diameter of N+ ring 26 be about 4–10 micrometers. This spacing is based on achieving the blocking capability of about 80 volts or higher on the anode.

It should also be mentioned that it is most desirable that the inner diameter of the middle N+ region 26 be larger than the outer diameter of the P+ island region 30, at least by about 10–50 percent. This requirement can be eliminated or made less stringent if a mesh-like N+ region 26 is used, such as shown in connection with FIGS. 4 and 5.

Analogously, I prefer that the middle N+ region not extend beneath the epitaxial layer 28 significantly more than the most significant electron depletion effect produced by the positive potential applied to the turn-off gate electrode 44, in order to further prevent the middle N+ region 26 from siphoning off any significant proportion of the holes injected into the epitaxial region 28 from the PNP emitter region 30. In general I would think that the middle N+ region 26 should not extend beneath the epitaxial region 28 more than about 3–15 micrometers. However, experimental results are needed to confirm this.

It should also be recognized that one can ordinarily make a thyristor conductive, i.e. start regenerative switching, by simply increasing the anode-cathode applied voltages. In my thyristor, such an effect can also occur. On the other hand, the pinch effect of the middle N+ ring 26 shields the anode from the cathode. Consequently, my thyristor can withstand higher anode-cathode voltages if one maintains a positive voltage applied to the turn-off gate electrode 44. In fact, I may prefer to always keep a voltage on gate 44 unless I want the thyristor turned on. For example, a COMFET can turn-on simply because of a rapid voltage rise on the anode or if the temperature significantly increases. Such an effect can occur in my device too. However, I can protect against it, by leaving a positive voltage on gate electrode 44.

Once my thyristor goes into the regenerative switching, i.e. latched mode, conduction characteristics of the device become independent of the voltage applied to the turn-on gate electrode 42. Accordingly, the voltage applied to the turn-on gate electrode 42 need not be maintained once the device is latched.

Figure 6:
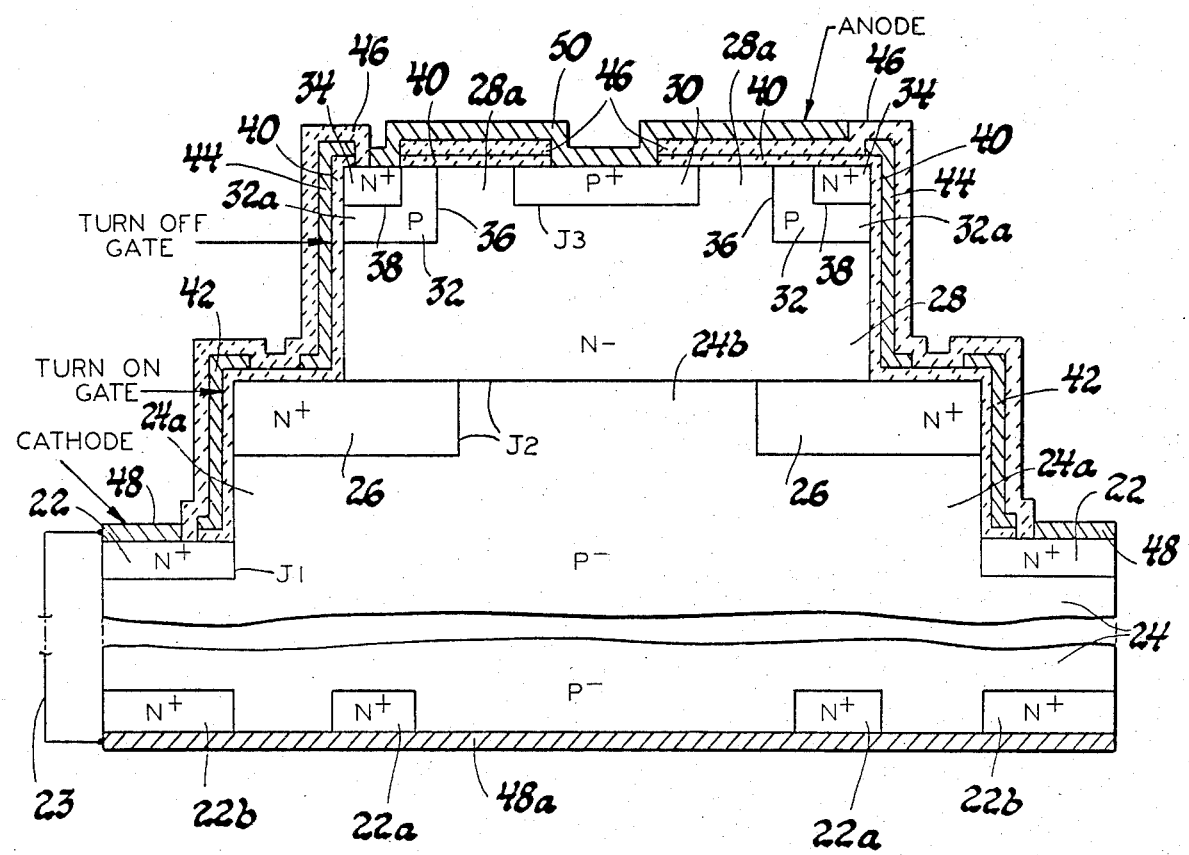

It should also be recognized that N+ ring 22 could have inner edge conformations to increase edge length, or be formed on the bottom side of P− body 24, as N+ rings 22a or 22b. Alternatively such N+ regions 22a and 22b could both be used in addition to N+ region 22, to increase the electron injection. Such a structure is shown in FIG. 6 of the drawing. These alternative or additional regions 22a and 22b should be laterally outside the central region when viewed from above, i.e. not directly below region 30, to prevent unintentional latching during turn-off, high temperature operation, or rapidly rising anode voltages.

An electrical contact could be made to each of N+ bottom rings 22a and 22b, and these contacts placed in low resistance electrical communication with the cathode 22 by means of an external jumper wire 23. However, such a construction is not shown. The reason for not showing it is that, in the uses I now contemplate, my device would more frequently be used only in the forward blocking mode. In such instance, I prefer to have the backside contact (i.e. bottom metallization) 48a extend entirely across the bottom surface of the device as shown in FIG. 6. This enhances higher temperature forward blocking characteristics and reduces the forward voltage drop of the device when it is turned on. In such a backside contact, N+ bottom rings 22a and 22b are electrically shorted to the P− body 24. This presents no difficulties when P− body 24 is thick, as in the case contemplated here. With P− body 24 being thick, its internal resistance is considerably higher than $R_{shunt}20$ between P− body center portion 24b and the lower N+ ring 22. Accordingly, $R_{shunt}20$ is still the controlling resistance for device turn-on, even though backside contact 48a is in low resistance electrical communication with cathode 48, such as by means of the external jumper wire 23. It should also be mentioned that contacts 48 and 48a and jumper wire 23 could even be integral parts of but one metallization coating, depending on the layout (i.e. geometry) of the device.

Figure 5:
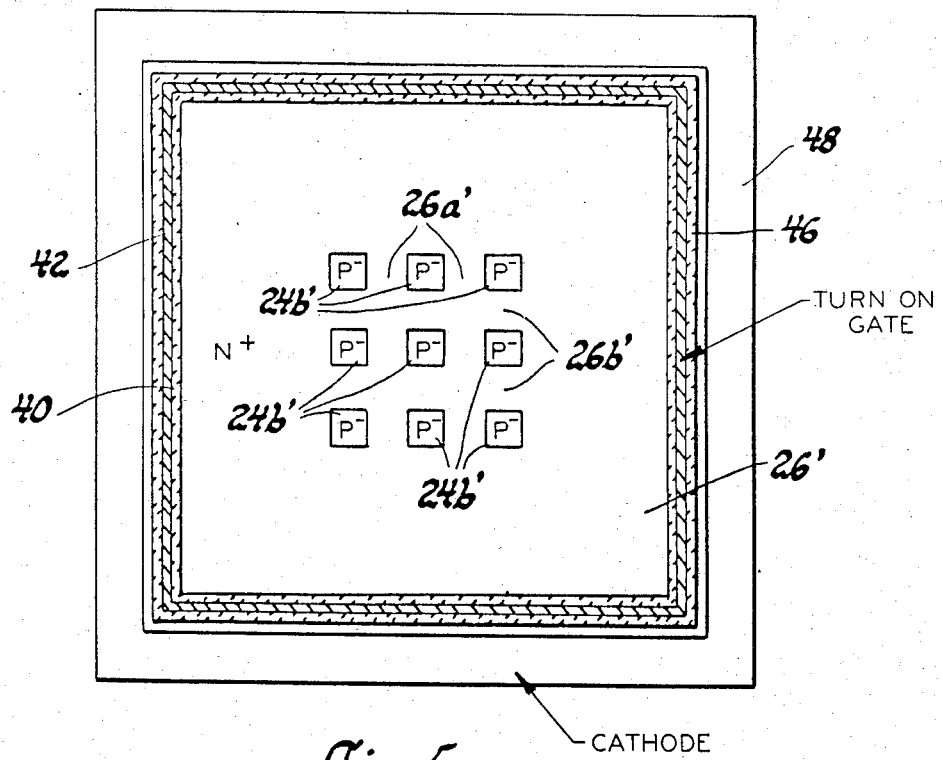

Analogously, it should also be recognized that a different pattern can be used to form the middle N+ ring 26. One such different pattern is illustrated in FIGS. 4 and 5. In fact, the only difference between the device shown in FIGS. 4 and 5 and the device shown in FIGS. 2 and 3 resides in the pattern of the middle N+ ring 26′. In FIGS. 2 and 3 the middle N+ ring 26 is a simple ring. In the device shown in FIGS. 4 and 5, the middle N+ ring 26′ also has a arrangement in its center. This lattice is integral column extensions 26a′ and integral row extensions 26b′. The intersecting rows and columns 26a′ and 26b′ leave a plurality of discrete portions 24b′ of the body 24′ therebetween. Each of these multiple discrete portions 24b′ can form an individual pinch-resistance region in the resultant structure. Accordingly, one can make a very large area device that can have a considerable power rating. Each individual pinch-resistance region 24b′ would then preferably have a width of about 4–10 micrometers, as was described in connection with portion 24b of FIGS. 2–3.

It should also be recognized that the N+ middle layer 26′ in FIGS. 4 and 5 need not be a lattice. For example, one may choose to only use rows 26a′ spaced 4–10 micrometers apart or columns 26b′ spaced 4–10 micrometers apart. It should also be recognized that the additional conformations on the inner periphery of the middle N+ layer 26 provides additional emitter edge, which enhances electron injection efficiency for the NPN transistor. Accordingly, the unique configuration of the middle N+ layer not only enhances turn-off characteristics of the device but also should make it turn-on faster.

Analogously, N+ rings 22 and 26 could be formed on the same tread. They do not have to be on different steps. In such instance, for example, middle N+ ring 26 would be on the same vertical level as lower N+ ring 22, which could be its own level as shown in the drawing on that of lower N+ ring 22. In any event, lower N+ ring 22 would be a concentric ring spaced outwardly from middle N+ ring 26 an appropriate distance to maintain $R_{shunt}$ at the desired value. Accordingly, one would only etch one groove, not two, to make the device.

I wish to also mention that my device has been shown as a vertical structure. On the other hand, it is expected that one could make an equivalent device in a horizontal, i.e. lateral, structure. The lateral structure could be quite similar to the left half of what is shown vertically in cross-section in FIG. 2. In such instance one end of a semiconductive film would be of one conductivity type, the other end would be of the opposite conductivity type with anode and cathode disposed at these opposite ends. The principal distinguishing feature would be that there would be an electrically floating middle N+ region connected to turn-on and turn-off IGFETs, to provide a pinch resistance in accordance with this invention.

Still further, I wish to mention that I electrically short upper N+ ring 34 to the anode 50 only to provide a convenient and simple source of positive potential for the drain region of the turn-off IGFET 16. One can alternatively provide a separate electrical contact (not shown) to upper N+ ring 34 and connect it to a separate source of positive potential (also not shown), which I may choose to refer to as $V_{DD}$. If anode voltage is approximately 80 volts, one can use a potential of only about 8–10 volts on $V_{DD}$. In such event, one need only use a voltage of about 4 or 5 volts on the gate electrode 44 of the turn-off IGFET 16 in order to turn off the entire thyristor. On the other hand, if the upper N+ ring 34 is electrically shorted to the anode 50 a considerably higher voltage may have to be applied to the gate electrode 44 in order to raise the voltage on N+ region 26 sufficiently to get a rapid turn-off. Use of such a high control voltage may not be desirable in some applications. Accordingly, it may be that one would prefer to have a separate electrical contact for the N+ ring 34.

My basic invention involves an electrical pinch effect produced by an electrically floating N+ region 26. The turn-off IGFET 16 is a means for applying a positive voltage to the N+ region 26. Other IGFET structures an invention involves an electrical pinch effect produced by an electrically floating N+ region 26. The turn-off IGFET 16 is a means for applying a positive voltage to the N+ region 26. Other IGFET structures and other means may be desired to bring up the desired positive potential for turn-off.

Still further it should be recognized that the N+ region 26 could be of any configuration which provides a pinch effect normal to the direction of current carrier flow in the device. This is irrespective of whether the device can be considered as a vertical cylindrical device or as a film (i.e. lateral) device. If it is to be made as a film device, one can provide an N+ region extending from one edge of the film almost across to the other edge, or two opposed regions extending toward one another from opposite edges. The edges can be the top and bottom of the film, or its sides. In any event, one would leave a small cross-sectional portion of the film forming the PNP collector region that would have a maximum dimension no greater than that which can be pinched off by the voltage being applied to the N+ region, or regions, 26. In other words, the portion of the PNP transistor collector region normal to the direction of current carrier flow would not have a maximum dimension larger than that which could be substantially depleted of carriers by the positive voltage applied to the contiguous N+ region 26. If a higher power device is desired, one can simply use a multiplicity of such pinch regions, such as is inherent to the lattice-type structure shown in connection with FIGS. 4 and 5.

The PN junctions J1–J3 are hereinbefore described as diffused junctions having particular doping levels. Other doping techniques can be used, as for example, ion implantation. Analogously, other doping levels can be used, depending on the electrical properties desired in the resultant device. Still further, the PN junctions J1 and J3 presumably might even be Schottky barriers, since they do not have to withstand high voltages. Schottky barriers for J1 and J3 should provide a lower forward voltage drop than diffused PN junctions, and for that reason may even be preferred.

The foregoing examples of my basic invention contemplate a thyristor in which positive voltages are used both to turn the device on and to turn it off. As indicated, the JFET produces a pinch resistance effect in the P− region 24b by the surrounding middle N+ ring 26. Turn-off of the device is produced by applying a positive voltage to the turn-off gate 44 of an N-channel IGFET that is formed between the middle N+ ring 26 and the upper N+ ring 34. The positive voltage on gate electrode 44 inverts a surface portion 32a of the P-type ring 32, so that the middle N+ ring 26 is brought into low resistance communication with the anode potential applied to the upper N+ ring 34. The anode potential reverse biases PN junction J2 to produce a pinch effect on the P− body portion 24b which it surrounds.

Figure 7:
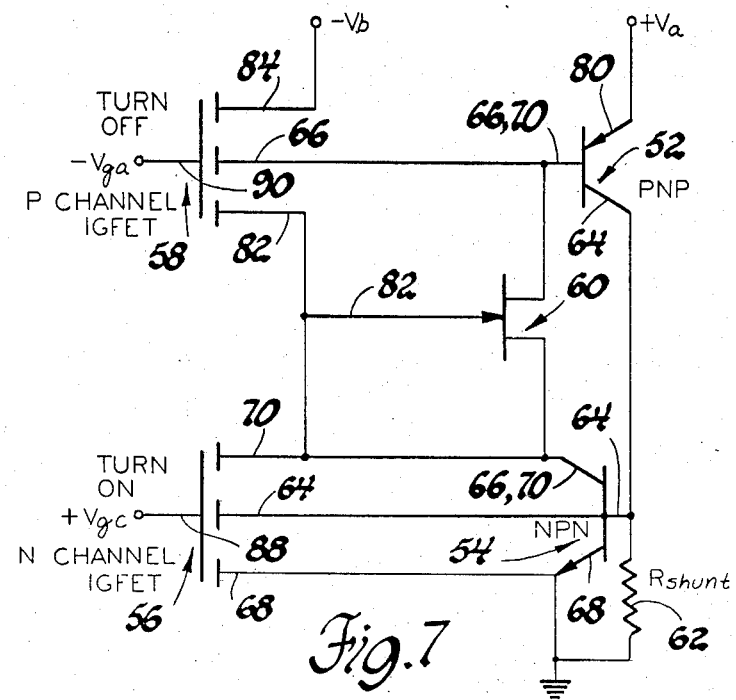
Figure 8:
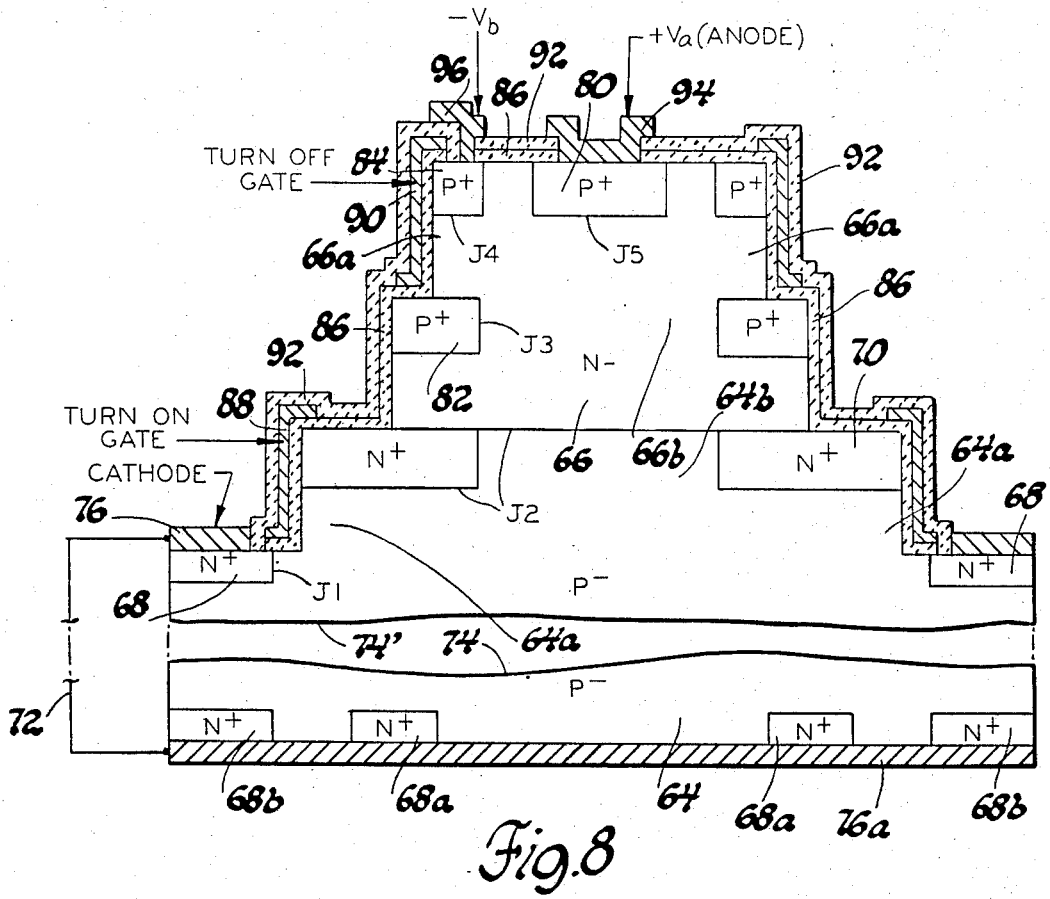

The embodiment of the basic invention illustrated in FIGS. 7 and 8 uses a P+ ring 82, a P-channel, IGFET 58, and a negative gate potential to turn the thyristor off. By negative, I mean negative with respect to the thyristor cathode. This embodiment of my device is schematically shown in FIG. 7. It can be considered as including a PNP transistor 52, an NPN transistor 54, an N-channel insulated gate field effect transistor (IGFET) 56, and a P-channel insulated gate field effect transistor (IGFET) 58. It also includes a pinch resistance which I prefer to refer to as a junction field effect transistor (JFET) 60. FIG. 7 also shows a resistance 62, that is identified as $R_{shunt}$. Resistance 62 is an internal resistance, between the emitter and base of the NPN transistor, that is used in the normal and accepted way to produce device turn-on when IGFET 56 is activated.

Reference is now made to FIG. 8 which shows a specific embodiment of the thyristor electrically represented by FIG. 7. As with the earlier figures of the drawing, this embodiment is not drawn to scale, to make illustration easier. The structure shown in FIG. 8 is a concentric type of device, as illustrated in the earlier figures of the drawing. Hence, it is symmetrical about its vertical center line.

More specifically, FIG. 8 shows a rectangular P− silicon body member 64 having a reduced cross-section zone on its side edge that forms a step. An N− layer 66, of smaller cross-section than P− body 64, is disposed on top of body 64, forming a second step on the side of the device. The N− layer has a reduced cross-section zone, that forms a third step on the side of the device. The top edge of N− layer 66 forms a fourth step on the device. Accordingly, the device shown in FIG. 8 is a four-step device, rather than a three-step device, such as is illustrated in the earlier figures of the drawing.

The lower portion of the FIG. 8 thyristor is quite similar to the lower portion of the devices illustrated in earlier figures of the drawing. For example, the tread-like portion of the lowest step on the P− silicon body 64 has a ring-like N+ region 68 on its circumference. The tread portion of the second step has an upper ring-like N+ region 70. The lower N+ ring 68 can have inner edge conformations to increase edge length. It can also be formed on the bottom side of the P− body 64, as N+ concentric bottom rings 68a or 68b. Alternatively, N+ bottom regions 68a and 68b could both be used in combination with the N+ ring 68 to increase the electron injection of the device. In such instance, the same electrical potential would be applied to the lower N+ ring 68 and the bottom N+ rings 68a and 68b by means of a common contact, a conductor communicating their contacts, etc. N+ bottom rings 68a and 68b have an electrical contact 76a across the entire-bottom, including exposed portion of P− body 64, for the same reasons discussed in connection with FIG. 6. As also similar to FIG. 6, I show contact 76a connected to contact 76 by means of a discrete conductor 72. This is because the thickness of the P− body 64 normally is so great, as indicated by the "break" lines 74 and 74′ in FIG. 8, that a common electrode contact on regions 68, 68a and 68b is not practical. However, in some other device geometries it might be desired. I consider the contact 76 on the upper surface of the device, not bottom contact 76a, as the principal electrode and have therefore designated it as the cathode in FIG. 8.

As with N+ ring 26 in the prior embodiments of the basic invention, the upper N+ ring 70 can be considered as being disposed on the periphery of the upper surface of the P− body of my device. Hence, it encircles a P− surface portion 64b of body 64 and extends to the outer edge of that surface. A spacing between the lower N+ ring 68 and the upper N+ ring 70 should be maintained to insure that there is adequate shunt resistance 62 between junctions J2 and J1. Spacings, doping levels, thicknesses, widths and the like, for the body portions and regions mentioned would be the same as in the preceding embodiments of the invention.

Also as illustrated in the preceding embodiments of the basic invention, there is an N− epitaxial layer 66 of the order of about 500–1,000 micrometers wide and about 20–500 micrometers thick disposed on the upper surface of the P− body 64, over its center portion 64b and overlapping onto only the inner circumferential portion of the upper N+ ring 70. The N− layer 66 could have a doping level of about $1 \times 10^{14}$ or $1 \times 10^{15}$ impurity atoms per cubic centimeter. The preferred width of layer 66 depends on the current capability desired for the device and, as a practical matter, the bonding wire diameter that is to be used and its anode. The preferred thickness of layer 66 depends upon the voltage breakdown characteristic desired. The range in width and thickness given is intended for a 5 ampere, 100 volt device. As in the prior embodiments, an island-like P+ region 80 is centrally disposed on the upper surface of the N− epitaxial layer 66. The P+ and N+ doping levels in this device can be about $1 \times 10^{19}$ to $1 \times 10^{20}$ impurity atoms per cubic centimeter as in the preceding embodiments of the basic invention.

Differing now from the prior embodiments of the basic invention, the N− layer 66 has a reduced cross-section zone that forms a third step on the side edge of the device. The tread portion of this third step has a ring-like P+ region 82 on its circumference. The upper surface of the N− layer 66 has a circumferential P+ ring 84 on its outer edge, outwardly spaced from the P+ island 80. The P+ ring 84 therefore forms the fourth, or top, step in this device structure. A PN junction J3 separates the lower P+ ring 82 from the N− epitaxial layer 66. PN junction J4 separates the upper P+ ring 84 from the N− epitaxial layer 66. PN junction J5 separates P+ island 80 from the N− epitaxial layer 66.

A 1,000–10,000 angstrom thick silicon dioxide film 86 of IGFET gate quality covers the top and sides of the epitaxial layer 66 and the silicon body 64. This silicon dioxide layer need not be uniform on the top and sides of the epitaxial layer 66 and the silicon body 64. On the sides of the epitaxial layer 66 and the body 64 it can be thicker on top of the epitaxial layer 66 than on its sides, where it is of a thickness less than about 1,500 angstroms. A first circumferential polycrystalline silicon electrode 88 is disposed on the first and second steps and on the interjacent riser portion, i.e. side wall, of the body 64 therebetween. Thus, it extends from the N+ lower ring 68 up to the N+ upper ring 70. A second circumferential polycrystalline silicon electrode 90 is disposed on the third and top steps and on the interjacent riser portion, i.e. side wall, of the epitaxial layer 66 therebetween. Thus, it extends from the P+ lower ring 82 to the P+ upper ring 84. These polycrystalline silicon electrodes can be formed as a single polycrystalline silicon layer followed by a proper delineation process to define them as separate electrodes. It should also be mentioned that electrode 90 extends between two P+ regions, not between two N+ regions, as in the earlier embodiments of this invention. P+ rings 82 and 84 thus form a P-channel IGFET in combination with the gate electrode 90.

A phosphosilicate glass coating 92 covers the dielectric coating 86 and the polycrystalline silicon gate electrodes 88 and 90. Windows in the phosphosilicate glass coating 92 and in the dielectric coating 86 are provided so that the metal electrode 76, referred to herein as a cathode, can make contact with the lower N+ ring 68. Windows are also provided in the phosphosilicate glass coating 92 and in the dielectric coating 86 over the P+ island region 80 and over the upper P+ ring 84. A metal electrode 94 is disposed in the window over the P+ island region 80. I refer to electrode 94 as an anode. Another metal electrode 96 is disposed in the window over the P+ ring 84. The metal electrode 96 is not shown as a ring electrode. However, it could be, if so desired.

Also differing from the prior embodiments, the FIGS. 7 and 8 embodiments require a source of negative electrical potential, with respect to the potential applied to the cathode. As can be seen a potential that is positive with respect to the cathode is applied to the metal electrode 94. A potential negative with respect to the cathode potential is applied to the metal electrode 96. By way of example, the cathode might be in low resistance electrical connection with an electrode in one of the middle cells of a group of serially connected voltaic cells forming a battery. Electrodes 94 and 96 would be respectively connected to outermost electrodes of the cell series. One might consider such a series of cells as a three-terminal battery.

No electrical contacts are shown to the gate electrodes 88 and 90 because in most instances the electrical contacts to such electrodes are formed on a surface area of body 64 at an area removed from the part of the device shown in the drawing. However, it is to be understood that appropriate means are provided to apply positive and negative potentials to the gate electrodes 88 and 90, respectively. Gate electrodes 88 and 90 are respectively identified as a turn-on gate and a turn-off gate in FIG. 8. If needed, windows could be provided in the overlying phosphosilicate coating 92 to make electrical contact to these electrodes.

As with the preceding embodiment of the basic invention, the lower N+ ring 68 forms a PN junction, identified as J1, with the P− body portion 64. The P− body portion 64 forms a second PN junction, identified as J2, with the upper N+ ring 70 and N− epitaxial layer 66. The epitaxial layer 66 forms a third PN junction, identified as J3, with the lower P+ ring 82. The N− epitaxial layer forms another PN junction, identified as J4, with the upper P+ ring 84. It forms still another PN junction, identified as J5, with the P+ island-like region 80.

Junctions J1 and J2 comprise the NPN transistor 54. Junctions J2 and J5 comprise the PNP transistor 52. Accordingly, it can be considered that the lower N+ ring 68 is an emitter region for the NPN transistor 54, while the P+ island-like region 80 is the emitter region for the PNP transistor 52. The P− body portion 64 can be considered as being both the base region of the NPN transistor 54 and the collector region of the PNP transistor. Analogously, the upper N+ ring 70 and its contiguous N− epitaxial layer 66 can be considered as being both the collector region NPN transistor 54 and the base region of the NPN transistor 52.

An N-channel IGFET is used to turn on this embodiment of my basic thyristor. It is indicated by reference numeral 56. It comprises the lower N+ ring 68 as a source region, the middle N+ ring 70 as a drain region, and the interjacent surface portion 64a of P− body 64 as a channel region. As previously mentioned, the IGFET 58 used to turn off this embodiment of my device is a P-channel IGFET. It is formed by the lower P+ ring 82 as a source region, the upper P+ ring 84 as a drain region, and the interjacent surface portion 66a of N− epitaxial layer 66 as a channel region. Polycrystalline silicon electrode 88 forms a gate electrode for turn-on of N-channel IGFET 56. It thus forms a turn-on control gate for this embodiment of my thyristor. Analogously, polycrystalline silicon electrode 90 forms a gate electrode for turn-off of P-channel IGFET 58. It thus forms a turn-off control gate for this embodiment of my thyristor.

It should be noted that a middle portion 66b of the N− epitaxial layer 66 is completely surrounded by the P+ lower ring 82. In other words, there is a portion of the base region of the PNP transistor, along the direction of current flow, that is completely encircled by the P+ ring 82. It should also be noted that the P+ ring 82 has no electrical contact to it. It is allowed to electrically float in accordance with the potentials applied to the anode electrode 94, the cathode 76, and the gate electrodes 88 and 90.

It should also be noted that the resistance $R_{shunt}$ indicated by reference numeral 62 in FIG. 7, is an internal resistance in the silicon body region 64, extending from portion 64b to the cathode contact 76. As is previously known for thyristors turned on by means of an insulated control gate, the shunt resistance 62 is of a value related to the characteristics of the turn-on IGFET that produces turn-on of the thyristor at a predetermined controlled gate voltage. While shunt resistance 62 should be considered here, it is of no more importance to my invention than it is to the prior single insulated gate controlled thyristors.

Assuming the thyristor embodiment shown in connection with FIGS. 7 and 8 is in a forward blocking state, with gate potential applied to neither IGFET 56 nor 58, it is turned on when a positive voltage $+V_{gc}$ is applied to the turn-on gate, reference numeral 88. This produces an N-type channel 64a in the portion of body 64 beneath gate electrode 88. The N-type channel provides a low resistance interconnection between N+ rings 68 and 70. Electrons can then readily flow from the cathode 76 to the N+ ring 70, for eventual collection by the anode 94. This forward biases the emitter-base PN junction J5 of the PNP transistor 52, tending to turn-on the PN transistor 52. This action provides holes for injection into the base region 64 of the NPN transistor 54 across its emitter-base PN junction J1. Since the emitter-base PN junction J1 is already forward biased, the supply of hole current provides base drive to the NPN transistor 54, tending to turn it on. The voltage drop across the shunt resistance 62 is sufficient to allow the forward bias of the NPN transistor 54 and the emitter-base PN junction J1. The current gain alpha of each of the two transistors increases as current increases. When the sum of the two alphas exceeds one, regenerative switching to a low voltage, high current state will take place, as in the preceding embodiment of the basic invention. Accordingly, for turn-on, this thyristor is similar to the prior single insulated gate thyristor and to the prior embodiment of the basic invention described herein.

Once regenerative switching starts, i.e. the NPN and the PNP transistors are latched, current flow occurs in the manner previously described. In each instance the positive voltage $+V_{gc}$ need not still be applied to make the device stay "on". I usually prefer to leave the $+V_{gc}$ applied until I am ready to turn the device off. Then I remove it to make the device ready for turn-off. One can stop the regenerative switching; i.e. turn off the thyristor, in this embodiment of the basic invention by applying a negative voltage $-V_b$ to the upper electrode 96 and a negative voltage $-V_{ga}$ to the turn-off gate, designated by reference numeral 90. Turn-off is achieved even if the anode-cathode voltage has not dropped at all.

In turning off this embodiment of the basic invention, a negative potential $-V_{ga}$ is applied to turn-off gate 90. However, it should be understood that a negative potential $-V_b$ is also being applied. In fact, $-V_b$ can be continuously applied, whether the device is on or off. As previously indicated, this produces a P-type channel 66a along the surface of the N− epitaxial layer 66 beneath turn-off gate 90. The P-type channel provides a low resistance electrical path between the two P+ rings 82 and 84, which brings the P+ ring 84 close to the negative potential $-V_b$ that is applied to electrode 96. When the lower P+ ring 82 is at a negative potential approaching $-V_b$, it acts as a junction field effect gate in pinching off the path for electron flow from the cathode 76 to the anode 94. The effect is analogous to the effect produced by N+ ring 26 in the preceding embodiment of the basic invention. It differs, however, in that this embodiment of the invention does not throttle the flow of holes through body portion 64b. Instead, this embodiment of the invention throttles the flow of electrons through the epitaxial layer portion 66b.

In other words, electron flow through the base 66, 70 of the PNP transistor 52 is restricted. It will be recalled that in the preceding embodiments of the basic invention hole flow through the collector of the same transistor was restricted. Restricting electron flow to anode 94 breaks the latch-up path in the device. Thus, conductivity modulation of the N+ region 66 rapidly ceases, which turns the device off, i.e. reestablishes the nonregenerative condition characteristic of the normally forward blocking state. I show the pinch resistance as a junction field effect transistor (JFET) 60 in which its source and drain would be bottom and top of the N− epitaxial layer portion 66b, respectively.

As in the prior embodiment of the invention, principal current flow would occur from the centrally disposed P+ island region 80 which is aligned over the central N− region 66b and P− region 64b. Since these regions are only lightly doped, the predominant hole and electron flow will occur from the P+ island 80 directly to these central portions aligned beneath it, rather than to the outlying portions beneath the upper N+ ring 70. When the negative potential is applied to the turn-off gate 90, the resulting circumferential negative field on the side wall of the epitaxial layer 66 tends to confine electron flow into the middle 66b of the epitaxial layers, precisely where one wants it to be, to provide a more effective pinch off.

Accordingly, in order to best throttle the anode-to-cathode electron current flow in accordance with my basic invention, it is desirable that the emitter 80 of the PNP transistor be centrally located and that the P-type body 64 and the N-type epitaxial layer 66 both be lightly doped. On the other hand, such doping is normally inherent to a thyristor. Accordingly, the same type of doping relationships and levels can be used in this embodiment of the invention that would ordinarily be used in any other thyristor.

As with the middle N+ ring 26 in the preceding embodiments of the basic invention, the lower P+ ring in this embodiment of the basic invention should have an inner diameter that is small enough to completely pinch off current flow through the surrounded region. In this case, it is electron flow through the central N− portion 66b. It should be remembered that this diameter is related to the voltage $-V_b$. The field effect, and therefore the voltage $-V_b$ needed, would also depend upon the voltage $+V_a$ applied at the anode 94, the conductivity of the turn-off IGFET 58, the conductivity of the P+ ring 82, current flow from anode-to-cathode, etc. The inner diameter of the P+ ring 82 can thus be varied, depending on a plurality of factors. However, for automotive applications I prefer that the inner diameter of the P+ ring 82 be about 4–10 micrometers. This basing is based on achieving the blocking capability of about 80 volts or higher on the anode.

Like the preceding embodiments of the basic invention, it is most desirable that the inner diameter of the lower P+ ring 82 be larger than the outer diameter of the P+ island region 80 by at least about 10–50%. This requirement can be eliminated or made less stringent if a lattice-like or mesh-like P+ region 82 is used instead of a simple ring, as mentioned in connection with the N+ region 26 in the earlier embodiments of this invention. In such a structure, the N-type material in each opening of the lattice or mesh is the functional equivalent of epitaxial layer portion 66b. It should also be mentioned that an equivalent device could be made in a horizontal, i.e. lateral, structure along the lines described for the preceding embodiments of the basic invention. Other variations can be made to this embodiment of the basic invention, along the lines of those hereinbefore described in connection with the preceding embodiments of the basic invention.

A device made in accordance with my basic invention offers distinct advantages in control capabilities. On the other hand, it appears to be subject to breakover at decreasing voltages with increasing temperatures. Accordingly, when it is not desired that the device be on, I prefer to keep it off by applying an appropriate voltage to its turn-off gate, i.e. gate 44 in FIGS. 2 and 6 and gate 90 in FIG. 8. It is also desirable to operate such a device at lower temperatures, as for example, below about 125°, to avoid having it inadvertently turn on if no turn-off gate voltage happens to be applied.

Still further, it should be understood that the single devices shown in the drawing are not necessarily used that way. A plurality of such devices can be formed on a single semiconductive body, such as a chip, to provide increased current handling capabilities.

The improvement claimed herein to the basic invention claimed in the concurrently filed U.S. Ser. No. 667,845 illustrated in FIGS. 9–14, as hereinbefore indicated. An important distinguishing feature of the improvement illustrated in these figures resides in the anode 98 not only contacting the first P-type region of the successive PNPN regions, but also contacting the first N-type region of those PNP regions. This produces an additional integrated NPN transistor designated by reference numeral 100 in FIG. 9. By "additional", I mean that the NPN transistor 100 is in addition to the usual integrated PNP transistor 102 and integrated NPN transistor 104 formed by the successive contiguous PNPN regions of a thyristor. As can be seen from FIG. 9, the usual NPN transistor 104 is designated by the legend NPN-1. The additional NPN transistor 100 is designated by the legend NPN-2.

As will hereinafter be more fully explained, the device illustrated in FIG. 9 operates and is made quite similarly to the basic thyristor structure hereinbefore described. Accordingly, the comments hereinbefore made with respect to the basic invention apply almost completely to this improvement on it as well. However, as can be seen from FIG. 9, the additional NPN-2, designated by reference numeral 100, has its collector 106 connected to the anode 98 through a resistance 108. The collector 110 of NPN-1 is connected to anode 98 through the emitter region 112 of the PNP transistor 102 as well as a collector series resistance (not shown) similar to the collector series resistance 108 for NPN-2. It can also be seen that the base region 114 of NPN-2 is separated from ground by the $R_{shunt}$ resistance 116. It is to be noted that the base region 120 of NPN-1 is also separated from ground by the $R_{shunt}$ resistance 116, as in the basic invention. As in the basic invention, the emitter 122 of NPN-2 and the emitter 124 of NPN-1 are each at ground potential. Accordingly, the resistance $R_{shunt}$, designated by reference numeral 116, provides a forward bias between the emitter and base regions of each of NPN-1 and NPN-2.

Figure 9:
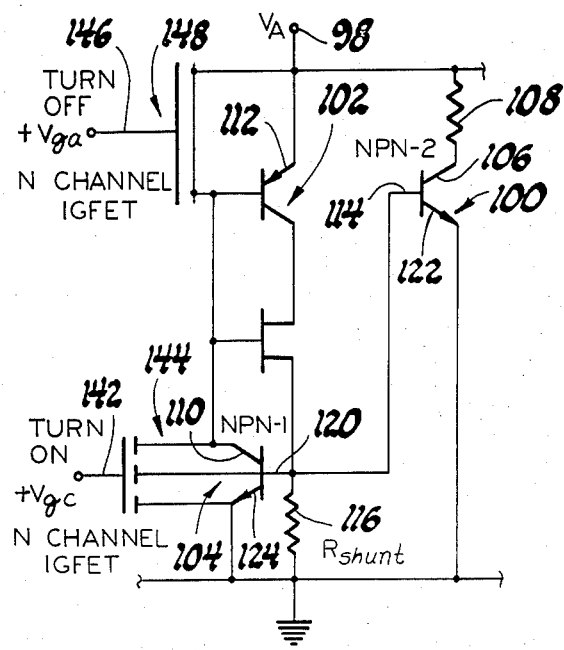
Figure 11:
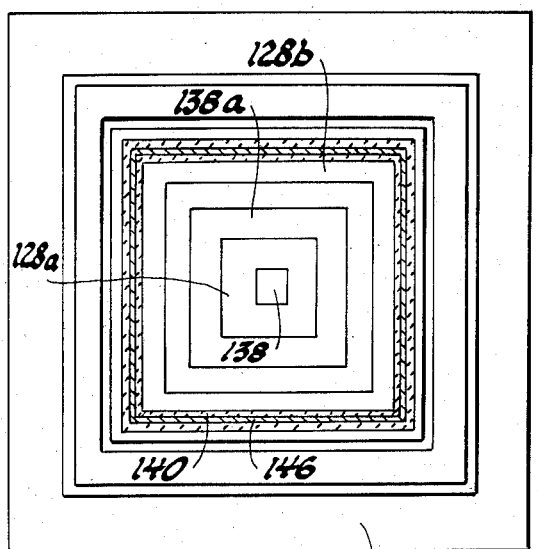
Figure 10:
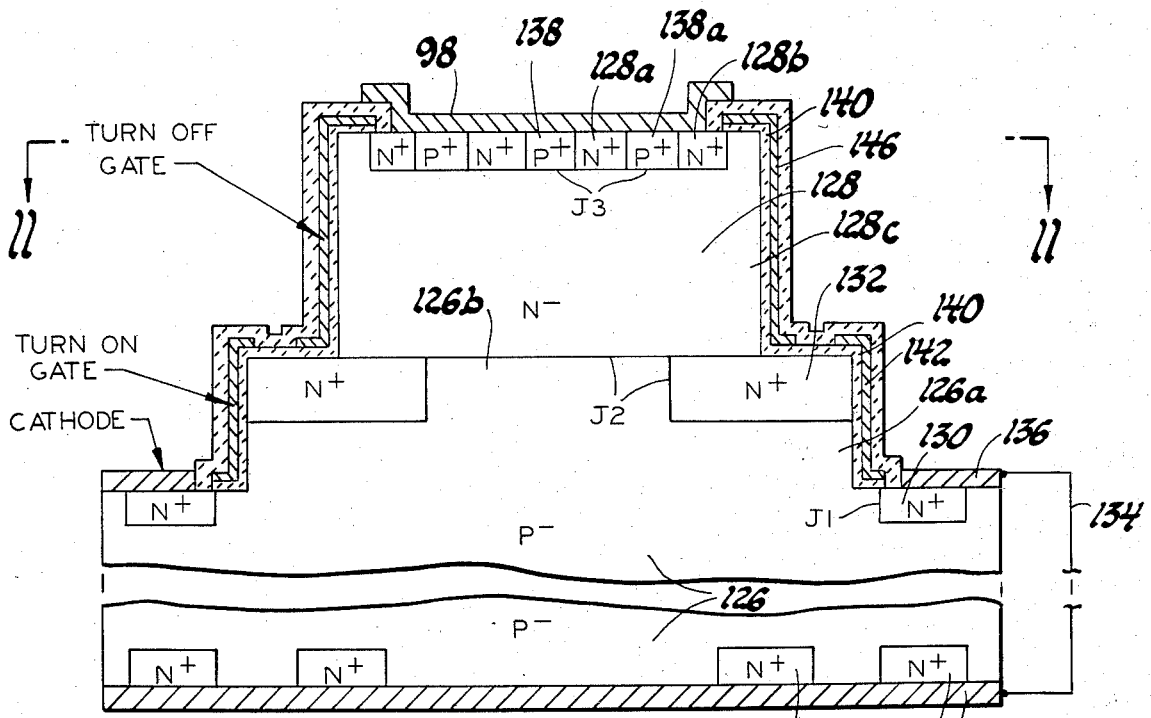
Figure 12:
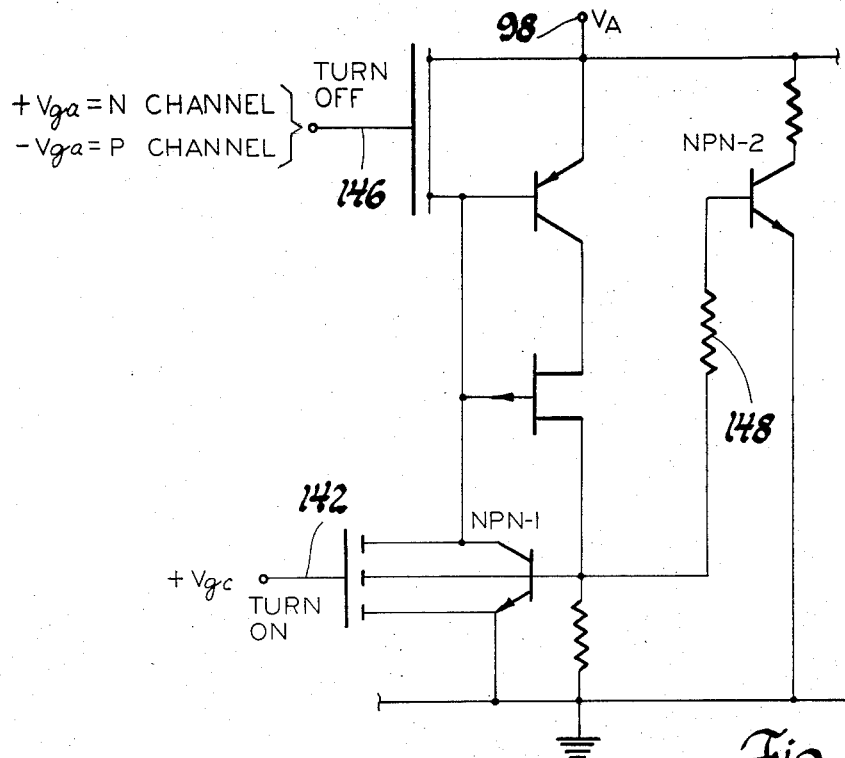

Reference is now made to FIG. 10, which shows a physical embodiment of the improvement which is schematically illustrated in FIG. 9. As with the earlier figures of the drawing, the embodiment in FIG. 10 is not drawn to scale, to make illustration easier. Similarly, it is a concentric type of device, that is symmetrical about its vertical center line. It is drawn as a 100 volt device. Dimensions, doping levels, etc. can thus be quite similar to those hereinbefore described, as well as modifications thereof and of geometries.

More specifically, FIG. 10 shows a rectangular P⁻ silicon body member 126 having a reduced cross-section zone on its side edge that forms a step. An N⁻ layer 128 of smaller cross-section than the P⁻ body 126 is disposed on top of body 126, forming a second step on the side of the device. Accordingly, the device shown in FIG. 10 is a three-step device, such as illustrated in the earliest figures of the drawing.

The lower portion of the FIG. 10 thyristor is quite similar to the lower portion of the devices illustrated in FIGS. 1–6 of the drawing. For example, the tread-like portion of the lowest step on the P⁻ silicon body 126 has a lower ring-like N+ region 130 on its circumference. The tread portion of the second step has an upper ring-like N+ region 132. The lower N+ ring 130 can have an inner edge conformation to increase edge length. It can also be formed on the bottom side of the P⁻ body 126 as concentric bottom ring-like N+ regions 130a and 130b. Alternatively, as shown in connection with FIG. 6, both the N+ bottom rings 130a and 130b can be used in combination with the N+ lower ring 130 to increase electron injection of the device. In such instance, the same electrical potential would be applied to both the lower N+ ring 130 and the bottom N+ rings 130a and 130b by means of a common contact or a conductor communicating their contacts as, for example, the conductor 134 which communicates their respective contacts 136 and 136a. It can be seen that the contact 136 and 136a not only overlie the lower N+ region 130 and bottom N+ regions 130a and 130b, but also overlie portions of the P⁻ body itself. I consider this desirable for the same reasons as outlined in connection with FIGS. 6 and 8. This enhances higher temperature forward blocking characteristics and reduces the forward voltage drop of the device when it is turned on. This presents no difficulties when the P⁻ body 126 is thick, as in the case contemplated here. By thick I mean 200–1000 micrometers thick. With the P⁻ body 126 being thick, its internal resistance is considerably higher than $R_{shunt}$ 116 between the P⁻ body center portion 126b and the lower N+ ring 130. Accordingly, $R_{shunt}$ 116 is still the controlling resistance for device turn-on, even though back side contact 136a is in low resistance electrical communication with the cathode 136 by means of the external jumper wire 134. As hereinbefore described, the contacts 136 and 136a and the jumper wire 134 could even be integral parts of but one metallization coating, depending on the layout (i.e. geometry) of the device.

As with the N+ ring 26 in FIG. 2, the upper N+ ring 132 in FIG. 10 can be considered as being disposed on the periphery of the upper surface of the P⁻ body 126. Hence, it encircles a P⁻ surface portion 126b of body 126 and extends to the outer edge of that surface. A spacing between the lower N+ ring 130 and the upper N+ ring 132 should be maintained to insure that there is an adequate shunt resistance, as previously indicated.

The lower N+ ring 130 forms a PN junction J1 with the body 126. The upper N+ ring 132 forms a PN junction J2 with the silicon body 126. Analogous spacing between J1 and J2 is important, too, for analogous reasons. Spacings, doping levels, thicknesses, widths, and the like, for the body portions in the regions mentioned would be the same as in the preceding embodiments of the invention.

The N⁻ epitaxial layer 128 that is disposed on top of the P⁻ body 126 forms an extension of the PN junction J2 over the body portion that is encircled by the upper N+ region 132. Nested in the upper surface of the N− epitaxial layer 128 are concentric regions of equal depth of alternate conductivity type. More specifically, a P+ island-like region 138 is surrounded by an N+ ring 128a. N+ ring 128a, in turn, is surrounded by a P+ ring 138a. The P+ ring 138a is, in turn, surrounded by an N+ ring 128b. P+ regions 138 and 138a each form a PN junction identified as J3 with the N− epitaxial region 128. The N+ concentric rings 128a and 128b form a low resistant contact with the overlying anode 98 to the epitaxial region 128.

The P− body has a P-type impurity level of about $1 \times 10^{14}$–$1 \times 10^{15}$ P-type impurity atoms per cubic centimeter. The N− epitaxial layer preferably has about $1 \times 10^{15}$ N-type impurity atoms per cubic centimeter. Each of the N+ regions preferably have a doping level of about $1 \times 10^{19}$ N-type impurity atoms per cubic centimeter, to insure formation of low resistance spike contacts. The upper N+ ring 132 has a thickness of about 4–8 micrometers. The P+ regions 138 and 138a and the N+ regions 128a, 128b, 130, 130b, and 130a all have a depth of about 2–4 micrometers. As in the preceding emodiments of this invention, the width of the P− body portion 126b, i.e. the inner diameter of the N+ ring 132, is about 4–10 micrometers, preferably 5–8 micrometers.

As in the preceding embodiment of the invention, the P− body portion is hundreds of micrometers thick. The combined height of the riser portion 126a of the P− body 126 and the N+ ring 132 is about 20–30 micrometers for a device that would have a 100 volt capability. It should be noted that the riser portion 126a would have a height considerably greater than that shown relative to the thickness of the N+ ring 132. Ordinarily riser portion 126a would be at least about 20 micrometers in height all by itself. The N− epitaxial layer 128 would also have a thickness of about 20–30 micrometers. Junction J2 is shown at the upper surface of the N+ ring 132 but in fact could lie anywhere along the thickness of the N+ ring 132, depending on the method in which the device has been formed.

The side edges of the device are covered with a 1,500–3,000 angstrom thick silicon oxide coating 140. A circumferential 5,000 angstrom thick polycrystalline silicon insulated gate electrode 142 overlies the riser portion 126a and the edges of the lower and upper N+ rings 130 and 132. This forms the insulated gate field effect transistor (IGFET) 144 shown in FIG. 9. The collector 110 of NPN-1 in FIG. 9 is in fact the N− epitaxial region 128 shown in FIG. 10, which is consistent with the preceding embodiments of the basic invention.

A 5,000 angstrom thick circumferential polycrystalline silicon insulated gate electrode 146 overlies the riser portion 128c, as well as the upper N+ ring 132 and the top N+ ring 128b. This provides a turn-off insulated gate field effect transistor (IGFET) designated by reference numeral 148 in FIG. 9. Both of these IGFETs 144 and 148 are enhancement devices since they will each produce an N+ channel along the riser portions 126a and 128c when a positive potential is applied to their respective insulated gate electrodes 142 and 146. It can thus be seen that the upper N+ ring 132 will have a voltage approaching that of the cathode or the anode, depending on whether or not voltage has been applied to the turn-on gate electrode 142. Hence, upper N+ ring 132 is electrically floating, as in the basic invention hereinbefore described.

When a positive potential is applied to the turn-on gate 142, the upper N+ ring 132 is brought closer to cathode potential. Electrons are thus injected into the N− epitaxial layer for collection at the anode 98, thus forward biasing the PN junction J3 to turn the device on in the manner hereinbefore described. Once the device turns on, of course, the potential drop between the anode and the cathode becomes very small.

To turn the device off, the positive potential applied to the turn-on gate 142 must be removed. In fact, it is desired that the turn-off gate 146 be brought to ground potential. This can be provided by a suitable inverter, not shown. In such instance, the upper N+ ring 132, i.e. the gate for the P-JFET are allowed to move towards the anode potential. A positive voltage is applied to the turn-off gate 146. The positive potential applied to the turn-off gate 146 causes an enhancement effect on the riser portion 128c. This produces an N+ channel in riser portion 128c that communicates the upper N+ ring 132 with the top N+ region 128b. As was hereinbefore noted, the top N+ region 128b contacts the anode 98. Accordingly, applying a positive potential to the turn-off gate 146 causes the upper N+ ring 132 to be strongly reversely biased. This, in turn, causes a strong electrical pinching of the hole path through the P-type JFET formed in the encircled upper region 126b of the P− body.

It will be observed that when the turn-on gate 142 is brought to ground potential, the N+ ring 132 will inherently approach anode potential, since it is separated from the top N+ region 128b only by the intervening thickness of the N− epitaxial region 128. Consequently, merely bringing the turn-on gate 142 to ground potential will inherently tend to turn the device off. However, a much faster turn-off can be obtained if a positive potential is concurrently applied to the turn-off gate. This produces a much lower resistance electrical communication between the upper N+ ring 132 and the top N+ ring 128b. The effect reduces the proportion of electrons crossing J3, which is the PNP transistor emitter-base junction. Hence, hole injection slows down too, to permit unlatching.

It should also be noticed that the second NPN transistor 100 in FIG. 9, i.e. NPN-2, is formed in parallel with the PNP transistor 102. NPN-2 also provides a shunting path for electron collection of the anode terminal 98, bypassing the base-emitter junction of the PNP transistor 102. However, the gain of this transistor is comparatively small. Nonetheless, if the turn-on gate 142 is at ground, it can still cooperate in turning the device off automatically.

It should thus be apparent that in this improvement on the basic invention, the turn-off gate is made optional. The improved device will work with or without the presence of turn-off gate 146. Without turn-off gate 146, the improved device will still turn off when turn-on gate 142 is at ground, but turn-off will occur at a slower speed. From another standpoint, the floating N+ ring 132 is separated from anode 98 only by the thickness of the N− epitaxial layer 128. Consequently, the floating N+ ring 132 would normally be at a potential approaching that of the anode 98, which tends to keep the device off.

Conversely, it is to be recognized that NPN-2 shunts some of the initially injected electrons directly to anode 98 without going through the junction J3. Consequently, latch-up does not occur until there are higher current densities than in the preceding embodiments of the basic invention. Analogously, the improved device will not accidentally turn-on as readily due to increased temperature or voltage spikes. Correspondingly, a high positive voltage $V_{gc}$ must be applied to the turn-on gate to turn the device on. Such a voltage perhaps has to be higher than in the basic invention illustrated in the FIGS. 1–8.

In order to maintain the floating N+ ring 132 at a voltage that is in fact below the anode voltage $V_a$, it may be preferred to have the N− layer 128 somewhat thicker than preferred for the N− epitaxial layer 28 in FIG. 2. As for example, in the FIG. 2 embodiment it may be preferred that the epitaxial layer 28 be about 20 microns thick for a 100 volt device, while in the present instance it would be preferred that the epitaxial layer 128 be about 30-40 micrometers thick, and at least 25-50% thicker than epitaxial layer 28 in FIG. 2. To represent this increased thickness, I have added the resistance 108 shown in series with the collector 106 of NPN-2. I have elected not to show it in series with the collector 110 of NPN-1 to avoid unnecessary complexity in the description.

It should also be considered that it may be desirable to have the P+ regions 138 and 138a be deeper than that of the N+ regions 128a and 128b, to provide a higher edge area, and therefore a higher injection efficiency.

An analogously functioning but slightly different device can be formed by recessing the floating N+ ring 132 more deeply below the surface of the P− body 126 so that junction J2 no longer intersects the N+ floating ring 132. In order to turn on the device illustrated in the added thickness of the P− silicon body 126 above the N+ ring 132 provides an internal series resistance identified by reference numeral 148 in FIG. 12.

Figure 13:
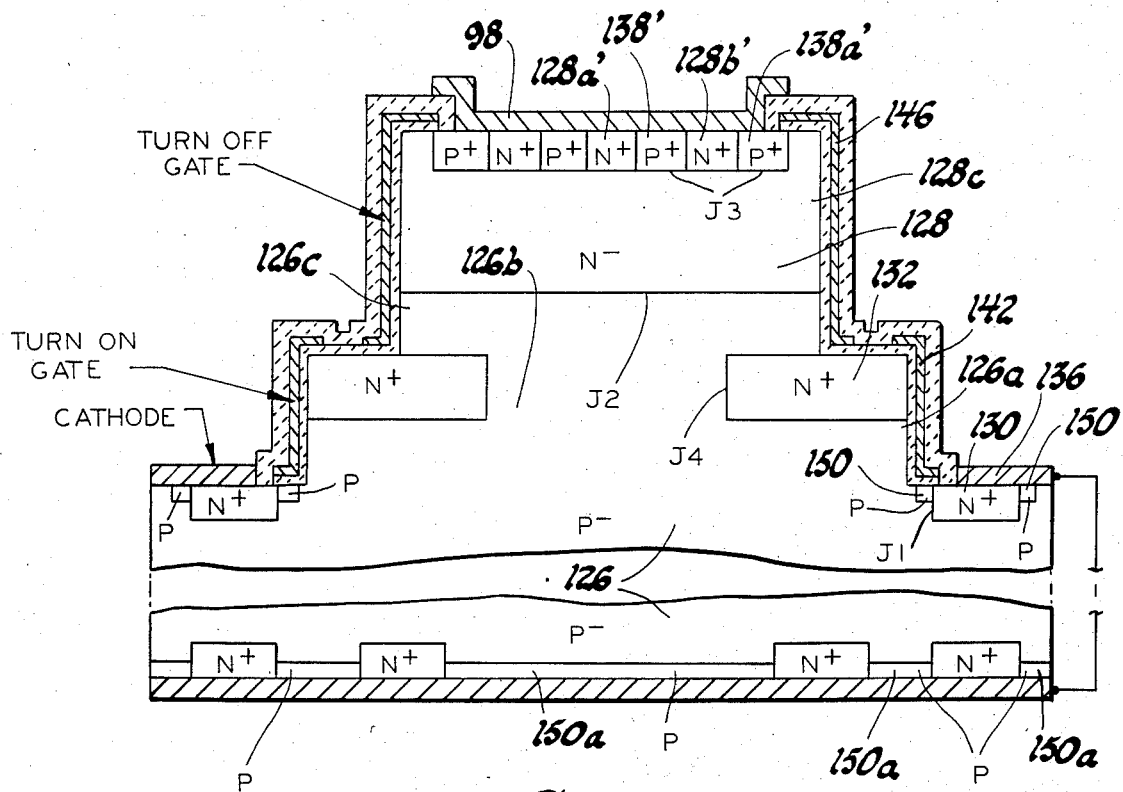

The alternative embodiment of my improvement shown in FIG. 13 illustrates that the junction J2 need not be located within the thickness of the upper N+ ring 132. It also illustrates that the P+ anode region need not be surrounded by a concentric N+ ring. In fact, both the P+ ring 138a and the N+ ring 128b could intersect the channel 128c.

As can be seen in FIG. 13, N+ region 128a' is an island surrounded by a P+ ring 138'. The P+ ring 138' is successively surrounded by a concentric N+ ring 128b' and a concentric P+ ring 138a'. The turn-off gate 146 thus extends between the outer P+ ring 138a' and the upper N+ ring 132. Upon application of a positive voltage to turn-off gate 146, the channel area 128c becomes enhanced and therefore more conductive. Analogously, a positive voltage can invert the channel area 126c between J2 and the upper N+ ring 132, to provide a lower resistance path between J2 and the upper floating ring 132.

In such instance, a lower resistance path is provided between anode 98 and upper ring 132 through the P+ outer ring 138', the upper N-type channel 128c, and the lower N-type channel 126c. Since there is a voltage drop across the forwardly biased junction J3, and perhaps a bit of a voltage drop along the channel 126c, the N+ ring 132 does not actually reach anode potential. On the other hand, it will be sufficiently close to significantly reversely bias the junction J4 and provide a pinch effect on hole flow through the attendant electrically constricted P− body portion 126b.

This embodiment of the invention is turned on by a positive electrical potential applied to the turn-on gate 142 in the same way as discussed in connection with FIG. 10 in the earlier figures of the drawing. It is to be noted that a P-type region 150 is included on either side of the cathode region 130 to reduce contact resistance with cathode 136 and to reduce spreading of the PN junction J1 when reversely biased. The P-type region 150a on the bottom of the P− body 126 also serves to reduce contact resistance.

It should also be noted that a P-type channel can be provided in the N− region 128c and the P− region 126c by applying a negative voltage to the turn-off gate 146. While it does not seem desirable to do so, it is recognized that in such instance junction J3 disappears with respect to the P-type channel 128c and P-type channel 126c becomes forwardly biased with respect to the N+ ring 132 at J4. In substance, this just substitutes a forwardly biased J4 PN junction for the forwardly biased J3 PN junction in the connection between anode 98 and N+ ring 132. Because of this potential alternative arrangement, FIG. 13 does not show direct connection between the anode 98 and the turn-off gate 146. On the other hand, in most instances it would be desirable to have a three-terminal, rather than a four-terminal device. In such instance, anode 98 would be directly shorted to the turn-off gate 146. Turn-off occurs in much the same manner as hereinbefore described in connection with FIGS. 9–11.

For a 100 volt device, channel 126c should be about 5-10 micrometers in length with channel 128c being about 20-25 micrometers in length. It is recognized that electrical shorting of the anode 98 to the turn-off gate 146 inherently increases the voltage $+V_{gc}$ that must be applied to the turn-on gate in order to latch-up the device. This can be considered a disadvantage or an advantage, depending on the application. It is an advantage in that higher temperatures and higher voltage spikes must occur before the device will accidentally turn-on, and the device will automatically turn-off as soon as the turn-on gate voltage is brought to ground potential. The turn-on gate voltage can be brought to ground potential easily enough by means of an inverter or the like.

Figure 14:
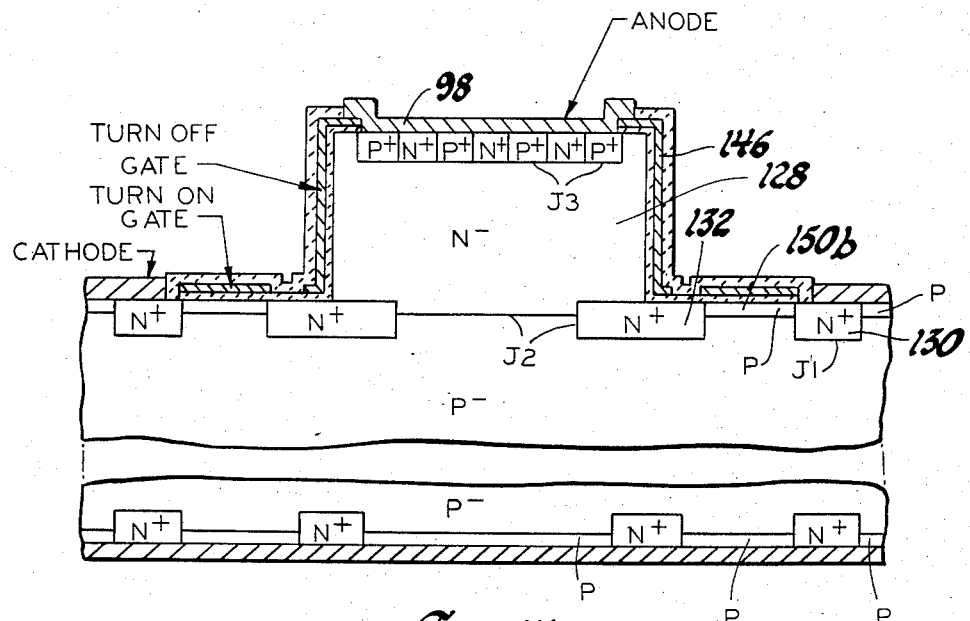
FIGS. 9-14 show the improvements on the basic invention described and claimed herein. More specifically.

Reference is now made to FIG. 14. In describing the basic invention, it was pointed out that my basic device need not be formed as a vertical device. It could be made as a lateral device. The improvement to the basic device claimed herein can also be made as a lateral device. One embodiment of the lateral device is shown in FIG. 14. This device includes essentially all the functional features illustrated in the FIG. 13 embodiment with three significant additions.

The first addition resides in that anode 98 is actually shown as shorted to the turn-off gate 146, such as hereinbefore described in connection with the preceding embodiments of this invention. The second addition resides in the showing of junction J2 as being disposed within the thickness of the N+ ring 132, as in the embodiment of the invention shown in FIG. 10. Moreover, the junction J2 is shown at about the middle of the thickness of the N+ ring 132 rather than at the top of the N+ ring 132. In the usual methods of fabrication there will be some up-diffusion of the N+ ring 132 into the overlying epitaxial layer 128. The inherent result is that junction J2 will be located somewhere nearer the middle of the thickness of the N+ ring 132 than near its top.

The third addition is in the length of the P-type region 150b between the N+ ring 130 and the N+ ring 132. It can-be seen that the P-type region 150b extends completely across the channel between the two N+ rings 130 and 132. For such a construction, the N-type rings 130 and 132 can be closer together, as for example 10–20 micrometers for a 100 volt design device while still exhibiting the same resistance to accidental turn-on by elevated temperatures or voltage spikes. The thickness of the epitaxial layer 128 would still preferably be about 20–30 micrometers. Increased thicknesses can be used of course, but would tend to increase forward resistance once the device is latched up.

The inner diameter of the N+ ring 132 would still preferably be somewhere of the order of 4–10 micrometers, preferably about 5–8 micrometers.

It should be apparent from the foregoing that depending on the turn-off speed requirement, it may not even be necessary to include a turn-off gate 146 in the structure. My device will work without the presence of a turn-off gate, so long as the turn-on gate is brought to ground potential. Additionally, because of the shunting action of NPN-2, the latching of my improved device occurs as a significantly higher current density. It can therefore be considered that the turn-on gate retains triggering control of my device even at higher current densities.

The embodiments of the invention in which an exclusive property or privilege is claimed are defined as follows:

1. A gate-controlled thyristor that not only has an IGFET for turn-on but also an IGFET and a variable resistance effect for turn-off, the thyristor comprising:
   a semiconductor body containing integrated bipolar PNP and NPN transistors that form a thyristor;
   the PNP transistor collector region having a portion overlapped, in a direction parallel to the direction of electron current flow in the PNP transistor collector region, by a region of opposite conductivity type semiconductive material that is of higher conductivity than the NPN transistor collector region and the overlapped portion of the PNP transistor collector region, for producing a PN junction space charge region effect that restricts electron flow through the PNP transistor collector region;
   an insulated gate electrode on said body, extending from emitter to collector regions of the NPN transistor, so as to form an integral enhancement type n-channel IGFET electrically in parallel with the NPN transistor emitter and collector regions;
   an electrode that is not only on the PNP transistor emitter region but also on a higher conductivity portion of the NPN transistor collector region, for simultaneously applying the same electrical potential to both the emitter region of the PNP transistor and the collector region of the NPN transistor;
   an electrode on the NPN transistor emitter region, for applying a second electrical potential thereto that is lower than the electrical potential applied to the PNP transistor emitter region; and
   means for providing an electrical potential, that approaches the electrical potential applied to the PNP transistor emitter region, to said opposite conductivity type region that overlaps the PNP transistor collector region, effective to produce a space charge region in the overlapped portion of the PNP transistor collector region that will inhibit electron current flow therethrough;
   whereby, after the aforesaid electrode potentials are applied to said electrodes, an electrical potential that is higher than the NPN transistor emitter potential can be applied to the gate electrode of the IGFET to turn on the thyristor, and thereafter an electrical potential that approaches that applied to the PNP transistor emitter-NPN transistor collector electrode can be provided to the opposite conductivity type region that overlaps the PNP transistor collector region to turn off the thyristor.

2. A gate-controlled thyristor that not only has an IGFET for turn-on but also an IGFET and a pinch resistor for turn-off, the thyristor comprising:
   a semiconductor body containing integrated bipolar PNP transistor and a first NPN transistor that form a thyristor for producing an integral pinch resistor than can pinch off electron current flow through the PNP transistor base region;
   a first insulated gate electrode on said body, extending from emitter to collector regions of the first NPN transistor, so as to form an integral enhancement type n-channel IGFET electrically in parallel with the first NPN transistor emitter and collector regions;
   the collector region of the PNP transistor having a portion overlapped, in a direction parallel to the direction of current flow in that collector region, by a portion of the first NPN transistor collector region that is of higher conductivity than either the overlapped PNP transistor collector portion or the majority of the remaining portions forming the first NPN transistor collector region, for producing a pinch resistor that can inhibit majority carrier current flow through the PNP transistor collector region;
   the emitter region of the PNP transistor being an island-like first P-type region disposed within the PNP transistor base region;
   at least one additional higher conductivity portion of the NPN collector region, noncontiguous the first-mentioned higher conductivity portion, effective to form a second NPN transistor collector region with emitter and base regions in common with the first NPN transistor;
   an electrode jointly on the PNP transistor emitter region and the second NPN transistor collector region;
   an electrode on the emitter region for the aforesaid NPN transistors; and
   a second insulated gate electrode on said body extending from the overlapping higher conductivity portion of the first NPN transistor collector region to the second NPN collector region, so as to form an integral enhancement type N-channel IGFET, which IGFET can provide a low resistance electrical connection between the overlapping higher conductivity portion of the first NPN transistor collector region and the PNP transistor emitter region-second NPN transistor collector region electrode;
   effective, after applying a given electrical potential to the NPN transistor emitter region electrode, and a higher electrical potential to the PNP transistor emitter region-NPN transistor collector region electrode, to allow an electrical potential higher than that applied to the NPN transistor emitter region electrode to be applied to the gate electrode of the first IGFET and turn on the thyristor by latching the PNP and NPN transistors, and to allow an electrical potential also higher than that applied to the NPN transistor emitter region electrode to be applied to the gate of the second IGFET to turn off the thyristor by pinching off electron flow through the base region of the PNP
electron flow through the base region of the PNP
transistor.

3. A gate-controlled thyristor that not only has an IGFET for turn-on but also an IGFET and a space charge region effect for turn-off, the thyristor comprising:
- a semiconductor body containing integrated bipolar PNP and NPN transistors that form a thyristor;
- the collector region of one of the transistors having a portion overlapped, in a direction parallel to the direction of current flow in that collector region, by a portion of the collector region of the other transistor that is of higher conductivity than either the overlapped one transistor collector portion or the majority of the remaining portions of the other transistor collector region, to produce a PN junction that separates the two collector regions and, if reversely biased, can inhibit majority carrier current flow through the collector region of said one transistor;
- means for applying an electrical potential to the higher conductivity portion of the other transistor collector region for reversely biasing the PN junction;
- an insulated gate electrode on said body, extending from emitter to collector regions of the other transistor, so as to form an integral IGFET electrically in parallel with the other transistor emitter and collector regions that is non-conducting unless a gate potential is applied to it that is similar in polarity to that applied to the higher conductivity portion of the other transistor collector region;
- an electrode on the one transistor emitter region and also on the other transistor collector region for concurrently applying an electrical potential to both regions that is similar in polarity to that applied to the higher conductivity portion of the other transistor collector region; and
- an electrode on the other transistor emitter region for applying an electrical potential thereto that is opposite in polarity from that applied to the higher conductivity portion of said other transistor collector region;
- whereby, after the aforesaid electrical potentials are applied to said region electrodes, an electrical potential similar in polarity to that applied to the one transistor emitter region can be applied to the gate electrode of the IGFET to turn on the thyristor, and thereafter said similar polarity electrical potential can be applied to the higher conductivity portion of said other transistor collector region to turn off the thyristor.

4. The thyristor of claim 3, wherein the additional higher conductivity portion is annulus that concentrically surrounds the island-like PNP transistor emitter region, an annular P-type region concentrically surrounds the higher conductivity annulus, a second higher conductivity annulus concentrically surrounds the annular P-type regions, the PNP transistor emitter region-NPN transistor collector region electrode contacts all of the annuli as well as the island-like PNP transistor emitter region, and the second insulating electrode extends from the overlapping higher conductivity portion of the first NPN transistor collector region to the second higher conductivity annulus.

* * * * *